(12) United States Patent  
Feng et al.

(10) Patent No.: US 10,788,859 B2  
(45) Date of Patent: Sep. 29, 2020

(54) DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Xiang Feng, Beijing (CN); Sha Liu, Beijing (CN); Yun Qiu, Beijing (CN); Zhaokun Yang, Beijing (CN); Xiao Sun, Beijing (CN); Qiang Zhang, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/345,177

(22) PCT Filed: Jun. 5, 2018

(86) PCT No.: PCT/CN2018/090008  
§ 371 (c)(1),  
(2) Date: Apr. 25, 2019

(87) PCT Pub. No.: WO2019/037511  
PCT Pub. Date: Feb. 28, 2019

(65) Prior Publication Data  
US 2019/0286193 A1 Sep. 19, 2019

(30) Foreign Application Priority Data  
Aug. 23, 2017 (CN) .......................... 2017 1 0730406

(51) Int. Cl.  
*G06F 1/16* (2006.01)  
*H04N 5/225* (2006.01)  
(Continued)

(52) U.S. Cl.  
CPC .......... *G06F 1/1637* (2013.01); *G06F 1/1686* (2013.01); *G09F 9/33* (2013.01);  
(Continued)

(58) Field of Classification Search  
CPC ........... G02F 1/13338; G02F 1/133308; G06F 1/1637; G06F 1/1686  
See application file for complete search history.

(56) References Cited

U.S. PATENT DOCUMENTS 9,479,758 B2 * 10/2016 Woo ...................... H04N 5/2257  
10,126,781 B2 * 11/2018 Ahn ...................... G06F 1/1605  
(Continued)

FOREIGN PATENT DOCUMENTS

CN 1798250 A 7/2006  
CN 103021278 A 4/2013  
(Continued)

OTHER PUBLICATIONS

International Search Report and Written Opinion issued in International Application No. PCT/CN2018/090008, dated Aug. 8, 2018, with English translation.

(Continued)

*Primary Examiner* — Adrian S Wilson  
(74) *Attorney, Agent, or Firm* — McDermott Will & Emery LLP

(57) ABSTRACT

The present disclosure provides a display device. The display device includes a display panel; a printed circuit board, which is disposed on a back side of the display panel; a sensor, which is disposed on a side of the printed circuit board close to the display panel; a receiving portion, which is disposed at a position of the display panel corresponding to the sensor, the sensor is embedded into the receiving portion.

5 Claims, 4 Drawing Sheets

(51) Int. Cl.
*H05K 1/18* (2006.01)
*G09F 9/35* (2006.01)
*G09F 9/33* (2006.01)

(52) U.S. Cl.
CPC ............. *G09F 9/35* (2013.01); *H04N 5/2251* (2013.01); *H04N 5/2257* (2013.01); *H05K 1/189* (2013.01); *H05K 2201/10128* (2013.01)

(56) References Cited

U.S. PATENT DOCUMENTS

| | | | |
|---|---|---|---|
| 2004/0021792 A1* | 2/2004 | Yasui | H04N 5/2253 348/373 |
| 2013/0016267 A1* | 1/2013 | Ko | G06F 1/1637 348/333.01 |
| 2014/0160348 A1 | 6/2014 | Wang et al. | |
| 2016/0011633 A1 | 1/2016 | Watanabe et al. | |
| 2018/0196475 A1* | 7/2018 | Bao | G06F 1/1637 |
| 2018/0259321 A1 | 9/2018 | Zhang | |
| 2018/0262602 A1 | 9/2018 | Zhang | |
| 2019/0286193 A1 | 9/2019 | Feng et al. | |
| 2019/0394373 A1* | 12/2019 | Zhang | H04M 1/0266 |

FOREIGN PATENT DOCUMENTS

| | | |
|---|---|---|
| CN | 204652455 U | 9/2015 |
| CN | 106506742 A | 3/2017 |
| CN | 106817450 A | 6/2017 |
| CN | 106843389 A | 6/2017 |
| CN | 106850897 A | 6/2017 |
| CN | 106935144 A | 7/2017 |
| CN | 106936954 A | 7/2017 |
| CN | 106941541 A | 7/2017 |
| CN | 107046588 A | 8/2017 |
| CN | 107331314 A | 11/2017 |
| JP | 2002-182293 A | 6/2002 |
| WO | 2014141893 A1 | 9/2014 |

OTHER PUBLICATIONS

First Office Action issued in Chinese Application No. 201710730406.9, dated Dec. 24, 2018, with English translation.
Second Office Action issued in Chinese Application No. 201710730406.9, dated May 28, 2019, with English translation.
Third Office Action issued in Chinese Application No. 201710730406.9, dated Sep. 10, 2019, with English translation.

* cited by examiner

DISPLAY DEVICE

CROSS-REFERENCE TO RELATED APPLICATION

This application is a national phase entry under 35 USC 371 of International Patent Application No. PCT/CN2018/090008 filed on Jun. 5, 2018, which claims priority to Chinese Patent Application No. 201710730406.9, submitted to Chinese Patent Office on Aug. 23, 2017, titled "A DISPLAY DEVICE", which are incorporated herein by reference in their entirety.

TECHNICAL FIELD

The present disclosure relates to the field of display technologies, and in particular, to a display device.

BACKGROUND

Screens in mobile display products (such as mobile phones or tablets) need an appropriate distance to edges of their frames to ensure the strength of the frames, which causes too large distance to the edges and not to ensure a higher screen occupation ratio, and this is a constraint for full screen display.

In order to enlarge a range of application, mobile display products in the market usually need to combine some components such as a camera, a receiver and so on into its own body to integrate multiple uses. Among them, a camera function is one of the key considerations for consumers to choose mobile display products. In order to meet the needs of users, mobile display products generally equipped with their own camera unit.

For a display device with a camera function, a prepared display panel and a camera unit may usually be assembled together to complete an assembly of the camera unit and the display panel, and then the display device with a camera function is obtained. The display panel may be a liquid crystal display panel.

SUMMARY

The present disclosure provides a display device, comprising: a display panel; a printed circuit board, which is disposed on a back side of the display panel; a sensor, which is disposed on a side of the printed circuit board close to the display panel; a receiving portion, which is disposed at a position of the display panel corresponding to the sensor, wherein, the sensor is embedded into the receiving portion.

Optionally, the sensor includes at least one of a front camera unit, a distance sensor and a receiver.

Optionally, the receiving portion is a through hole or a groove, the sensor is embedded into the through hole or the groove.

Optionally, the receiving portion is disposed in a non-display region of the display panel.

Optionally, the printed circuit board is bound to the display panel by a flexible printed circuit and a driving integrated circuit; the receiving portion and the driving integrated circuit are arranged side by side in an extension direction of the driving integrated circuit.

Optionally, the receiving portion is disposed in a display region of the display panel.

Optionally, the receiving portion is disposed at a corner of the display region close to the printed circuit board.

Optionally, the display device further includes a backlight disposed between the display panel and the printed circuit board, a backlight receiving portion is disposed at a position corresponding to the sensor on the backlight, the sensor passes through the backlight receiving portion.

Optionally, the printed circuit board is provided with a rear camera unit on a side far away from the display panel.

Optionally, the front camera unit and the rear camera unit are staggered.

Optionally, the front camera unit, and/or the rear camera unit is integrated on the printed circuit board.

Optionally, the front camera unit, and/or the rear camera unit is a compound eye camera.

BRIEF DESCRIPTION OF THE DRAWINGS

In order to describe technical solutions in embodiments of the present disclosure more clearly, the accompanying drawings to be used in the description of embodiments will be introduced briefly. Obviously, the accompanying drawings to be described below are merely some embodiments of the present disclosure, and a person of ordinary skill in the art can obtain other drawings according to these drawings without paying any creative effort.

DETAILED DESCRIPTION

The technical solutions in embodiments of the present disclosure will be described clearly and completely with reference to the accompanying drawings in embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

Figure 1:
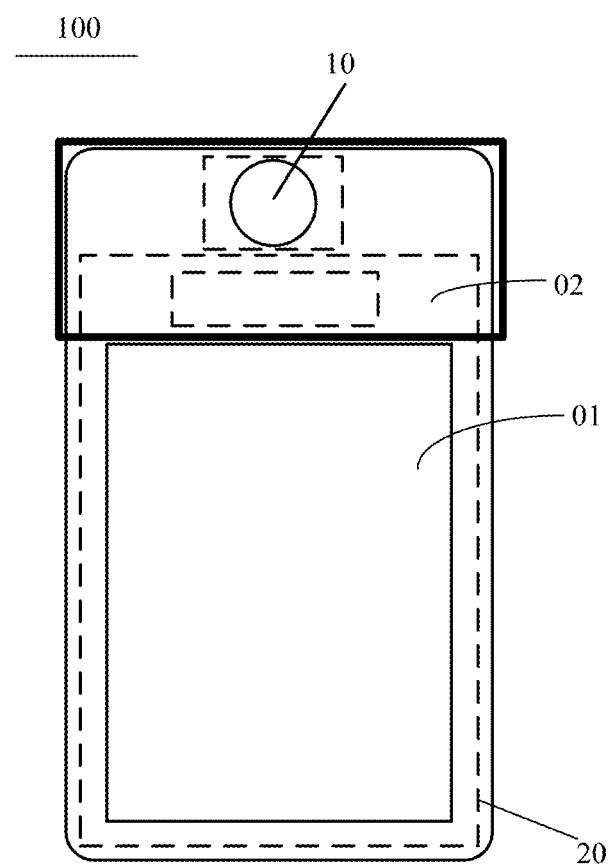
FIG. 1 is a structural schematic diagram showing an exemplary display device according to some embodiments of the present disclosure.

FIG. 1 is a structural schematic diagram showing an exemplary display device according to some embodiments of related art. As shown in FIG. 1, a camera unit 10 is usually disposed in peripheral region of a display panel 20. The display panel 20 includes a display region 01 and a non-display region 02. The non-display region 02 is provided with a display panel circuit, a position where the camera unit 10 is located is provided with a camera and a camera unit circuit. The display region 01 of the display panel 20 is a display region of the entire display device 100. Therefore, in order to reserve sufficient space for the camera unit 10 and the display panel circuit, a frame (the upper frame in FIG. 1, i.e., the region enclosed by the black broader lines) on a side of the display device 100 provided with the camera unit 10 is wide, then the screen occupation ratio (ratio of the display region 01 to the front surface of entire display device) of the display region 01 of the display device 100 is reduced.

Figure 2:
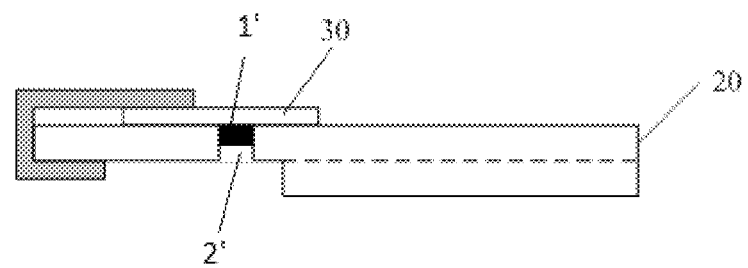
FIG. 2 is a structural schematic diagram 1 showing a display device according to some embodiments of the present disclosure.

Moreover, some embodiments of the present disclosure provide another display device, as shown in FIG. 2, which includes the display panel 20, a printed circuit board 30 disposed on the back surface of the display panel 20, a sensor 1' disposed on the printed circuit board 30, and a receiving portion 2' disposed on the display panel 20. The sensor 1' is disposed on a side of the printed circuit board 30 close to the display panel 20, that is, the sensor 1' is disposed on a side of the printed circuit board 30 facing the display panel 20. The receiving portion 2' is disposed on a position of the display panel 20 corresponding to the sensor 1'. The sensor 1' is embedded into the receiving portion 2'.

Embedding the sensor 1' into the receiving portion 2' may realize that disposing the sensor 1' on the display panel 20 instead of components other than the display panel 20. Therefore, it is not necessary to reserve a space for disposing the sensor 1' in an external region of the display panel 20 when the display device is manufactured, so that a width of the region that cannot be used for display in the display device is reduced, and not only an integration degree of the components of the display device can be increased, the screen occupation ratio of the display region can also be increased.

The sensor 1' includes at least one of a front camera unit, a distance sensor and a receiver. The receiving portion 2' is a through hole or a groove, the sensor 1' is embedded into the through hole or the groove. Hereinafter, taken the sensor 1' including a front camera unit 11 and the receiving portion 2' being a first through hole 21 as an example for description. In this case, the printed circuit board 30 is provided with the front camera unit 11 on a side close to the display panel 20, the display panel 20 is provided with the first through hole 21 on a position corresponding to the front camera unit 11, and the front camera unit 11 is embedded into the first through hole 21. Of course, it is also possible to provide a groove on a side of the display panel 20 close to the front camera unit 11, and the front camera unit 11 is accommodated in the groove. In some embodiments of the present disclosure, in order not to affect the use of the front camera unit, a bottom of the groove is transparent. A substrate made of transparent material may be used for manufacturing the display panel 20.

It should be noted that, firstly, the printed circuit board 30 may be bound to the display panel 20 by, for example, a flexible printed circuit (FPC).

The display panel 20 may be a liquid crystal panel, or a flexible or rigid organic electroluminescent diode display panel.

Secondly, the front camera unit 11 includes components such as a lens and a camera unit circuit etc., every component of the front camera unit 11 is entirely or partially embedded into the first through hole 21, all of these situations belong to "the front camera unit 11 is embedded into the first through hole 21" disclosed by some embodiments of the present disclosure.

Thirdly, it should be understood by one person skilled in the art that, the front camera unit 11 is adopted by the user to take a picture on a front side of the display device, therefore, the lens must not be blocked by other components when the front camera unit 11 is in operation. That is, if there are other components between the front camera unit 11 and the display panel 20, a through hole should be disposed at a position of the components corresponding to the lens of the front camera unit 11; similarly, if there are other components that block the front camera unit 11 disposed on the front side of the display panel 20, a through hole should also be disposed at a position of these blocking components corresponding to the lens of the front camera unit 11, or the blocking components may be moved away.

The front side of the display panel 20 is the display side of the display panel 20; the back side of the display panel 20 is the side opposite to the display side.

Fourthly, the front camera unit 11 may be assembled on the printed circuit board, or some of the components of the front camera unit 11 may be integrated on the printed circuit board.

Fifthly, the first through hole 21 of the display panel 20 may be realized, for example, by a shape cutting technology.

In the display device provided by some embodiments of the present disclosure, the front camera unit 11 is disposed on the printed circuit board 30, and the front camera unit 11 is embedded into the display panel 20, in this way, it is not necessary to reserve a space for a camera unit in peripheral region of the display panel 20 when manufacturing the display device, so that a width of the non-display region of the display device is reduced, and not only an integration degree of the components of the display device can be increased, the screen occupation ratio of the display region can also be increased.

Figure 3:
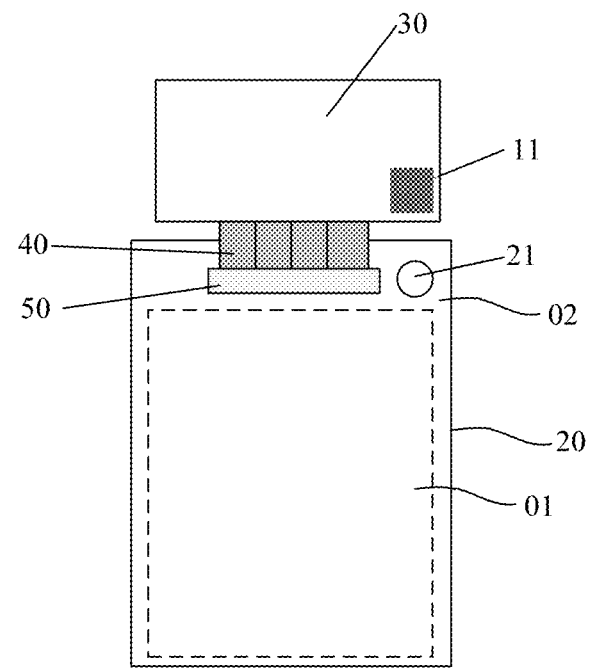
FIG. 3 is a structural schematic diagram 2 showing a display device according to some embodiments of the present disclosure.

As shown in FIG. 3, in some embodiments of the present disclosure, the first through hole 21 is disposed in the non-display region 02 of the display panel 20.

That is, the display region 01 of the display panel 20 serves as a display region of the display device, the non-display region 02 is provided with the first through hole 21 for allowing the front camera unit 11 to work normally.

The non-display region 02 is disposed to form a circle around the display region 01, the first through hole 21 may be disposed at any position within the non-display region 02, the position of the first through hole 21 in FIG. 3 is merely schematic.

As shown in FIG. 3, the printed circuit board 30 is bound to the display panel 20 by a flexible printed circuit 40 and a driving integrated circuit 50; the first through hole 21 and the driving integrated circuit 50 are arranged side by side in an extension direction of the driving integrated circuit 50.

The driving integrated circuit 50 is disposed on one side of the display region 01, the first through hole 21 is also disposed on the same side, and the first through hole 21 is disposed on an extension line of the driving integrated circuit 50.

That is, in the four sides of the driving integrated circuit 50, one of the four sides is provided with a flexible printed circuit 40, the other three sides may all be provided with the first through hole 21, in order to reduce the area of the non-display region 02, the first through hole 21 is disposed on a side of the driving integrated circuit 50 close to an edge of the non-display region 02 other than disposed on a side of the driving integrated circuit 50 close to an edge of the display region 01.

Figure 4:
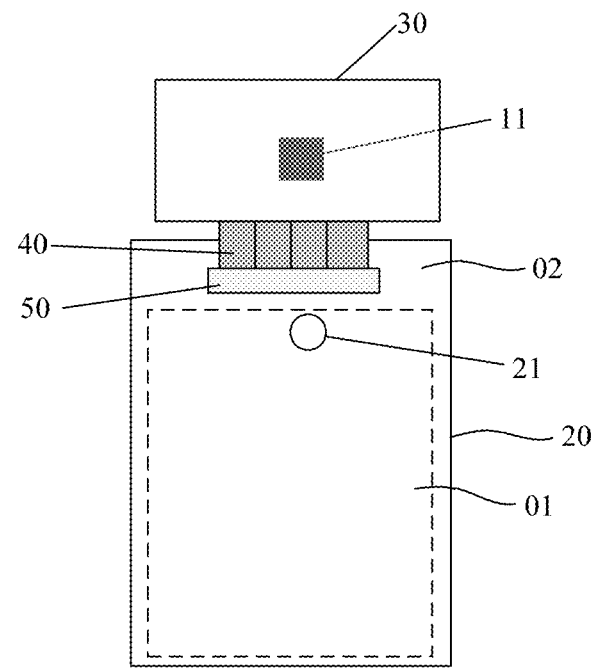
FIG. 4 is a structural schematic diagram 3 showing a display device according to some embodiments of the present disclosure.

In some embodiments of the present disclosure, as shown in FIG. 4, the first through hole 21 is disposed in the display region 01 of the display panel 20.

Of course, the first through hole 21 may be disposed at any position within the display region 01, and in order to reduce an influence on the visual effect of the users, the first through hole 21 is disposed at a position close to an edge of the display region 01.

Figure 5:
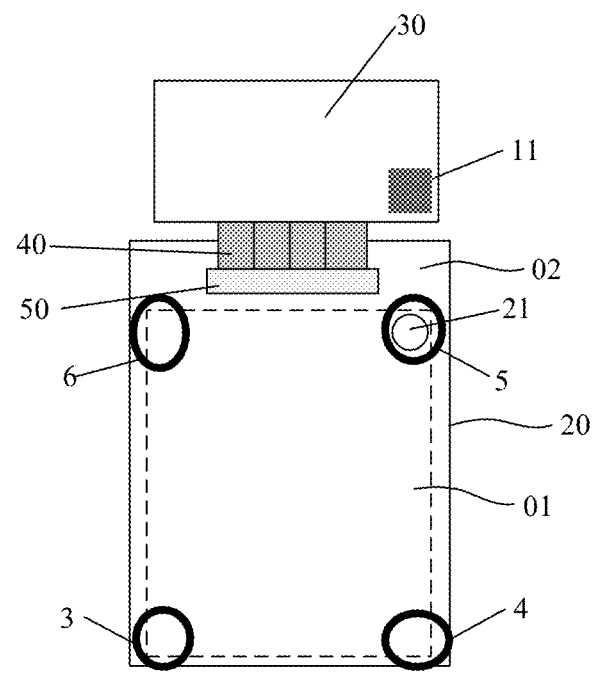
FIG. 5 is a structural schematic diagram 4 showing a display device according to some embodiments of the present disclosure.

Based on this, as shown in FIG. 5, in some embodiments of the present disclosure, the first through hole 21 is disposed at a corner of the display region 01 close to the printed circuit board 30.

That is, as shown in FIG. 5, the display region 01 has a total of four corners (circled by four thick solid circles) labeled with 3, 4, 5 and 6, and the first through hole 21 is disposed at a corner labeled with 5 or 6.

Figure 6:
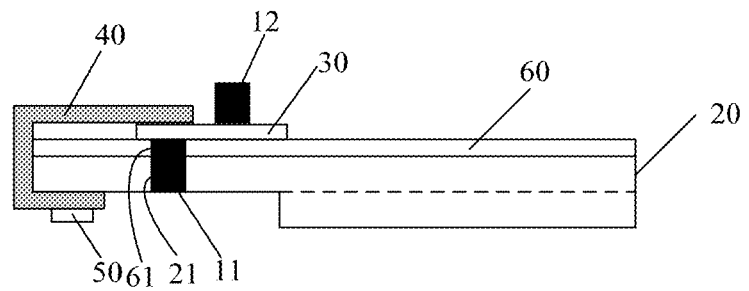
FIG. 6 is a structural schematic diagram 5 showing a display device according to some embodiments of the present disclosure.

In some embodiments of the present disclosure, as shown in FIG. 6, the display device further includes a backlight 60 disposed between the display panel 20 and the printed circuit board 30, a backlight receiving portion is disposed at a position of the backlight 60 corresponding to the front camera unit 11. Sensors pass through the backlight receiving portion, hereinafter, taken the backlight receiving portion being a second through hole 61 as an example for description (the front camera unit 11 passes through the second through hole 61 and is embedded into the first through hole 21).

In FIG. 6, the display panel 20 includes an array substrate and a color film substrate, and the backlight 60 is disposed on a side of the array substrate away from the color film substrate, however, the above structure is merely illustrative, the backlight 60 may also be disposed on a side of the color film substrate away from the array substrate, of course, other structures are also allowed.

As shown in FIG. 6, the printed circuit board 30 is further provided with a rear camera unit 12 on a side far away from the display panel 20.

The rear camera unit 12 may be assembled on the printed circuit board 30, or may be integrated on the printed circuit board 30.

It should be understood by one person skilled in the art that, the rear camera unit 12 is adopted by the user to take a picture of the back side of the display device, therefore, its lens must not be blocked by obstructions when the rear camera unit 12 is in operation.

By disposing the rear camera unit 12 on the printed circuit board 30 in some embodiment of the present disclosure, not only the integration degree of the display device can be improved, but also the screen occupation ratio of the display region 01 is increased.

Figure 7:
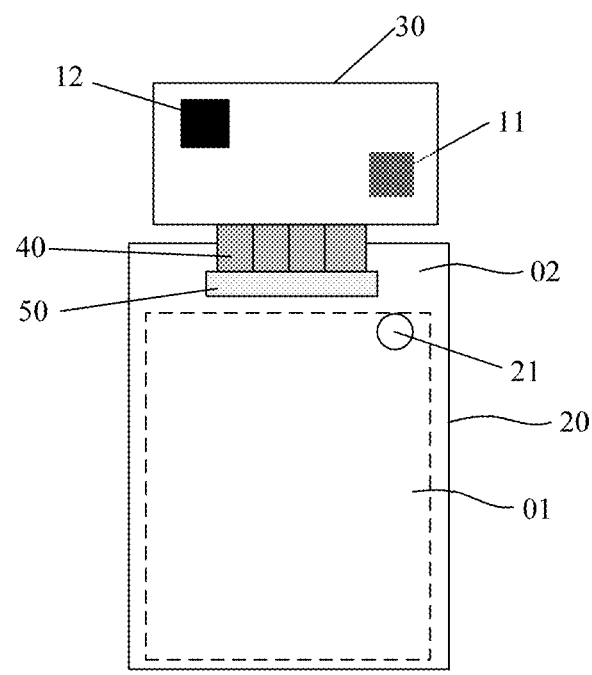
FIG. 7 is a structural schematic diagram 6 showing a display device according to some embodiments of the present disclosure.

In order to make the display device light and thin, optionally, as shown in FIG. 6 and FIG. 7, the front camera unit 11 and the rear camera unit 12 are staggered, that is, the orthographic projections of the front camera unit 11 and the rear camera unit 12 on the printed circuit board 30 do not overlap.

In order to make the display device light and thin, optionally, the front camera unit 11 or the rear camera unit 12 is integrated on the printed circuit board 30.

Optionally, the front camera unit 11 and the rear camera unit 12 are both integrated on the printed circuit board 30.

That is, the front camera unit 11 and the rear camera unit 12 are both integrated on the printed circuit board 30, or only one of them is integrated on the printed circuit board 30.

Integration means that a circuit of a camera unit is directly manufactured on the printed circuit board 30, so that the printed circuit board not only has a circuit of the display panel 20, but also a circuit of a camera unit. For example, a camera unit may be integrated on the printed circuit board 30 by chip on flex (COF) technology.

The front camera unit 11 and the rear camera unit 12 may be any camera having a camera function on the market, in order to improve the camera effect of the display device, optionally, the front camera unit 11 or the rear camera unit 12 may be a compound eye camera.

Optionally, the front camera unit 11 and the rear camera unit is 12 are both the compound eye camera.

It should be noted that, the display device may be any product or component having a display function such as: a liquid crystal display panel, a electronic paper, an organic light-emitting diode (OLED) panel, a mobile phone, a tablet computer, a television, a display, a notebook computer, a digital picture frame, a navigator, etc.

The foregoing descriptions are merely some specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A display device, comprising:
a display panel;
a printed circuit board, which is disposed on a back side of the display panel;
a rear camera unit, which is provided on a side of the printed circuit board far away from the display panel;
a sensor, which is disposed on a side of the printed circuit board close to the display panel, wherein the sensor comprises at least one of a front camera unit, a distance sensor and a receiver;
a receiving portion, which is disposed at a position of the display panel corresponding to the sensor, wherein,
the sensor is embedded into the receiving portion, and the receiving portion is disposed at a right corner of the display region of the display panel; and the display region is located in a display side of the display panel;
the front camera unit and the rear camera unit are staggered; and
the front camera unit and the rear camera unit is integrated on the printed circuit board.

2. The display device according to claim 1, wherein, the receiving portion is a through hole or a groove, the sensor is embedded into the through hole or the groove.

3. The display device according to claim 1, wherein, the receiving portion is close to the printed circuit board.

4. The display device according to claim 1, wherein, the display device further includes a backlight disposed between the display panel and the printed circuit board, a backlight receiving portion is disposed at a position corresponding to the sensor on the backlight, the sensor passes through the backlight receiving portion.

5. The display device according to claim 1, wherein, the front camera unit and the rear camera unit are compound eye cameras.

* * * * *